United States Patent
Tamiya

(10) Patent No.: US 10,024,911 B2
(45) Date of Patent: Jul. 17, 2018

(54) DEBUG CIRCUIT, SEMICONDUCTOR DEVICE, AND DEBUG METHOD

(71) Applicant: FUJITSU LIMITED, Kawasaki-shi, Kanagawa (JP)

(72) Inventor: Yutaka Tamiya, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 144 days.

(21) Appl. No.: 15/019,358

(22) Filed: Feb. 9, 2016

(65) Prior Publication Data

US 2016/0282413 A1    Sep. 29, 2016

(30) Foreign Application Priority Data

Mar. 27, 2015  (JP) ................ 2015-066456

(51) Int. Cl.
G06F 11/00 (2006.01)
G01R 31/317 (2006.01)

(52) U.S. Cl.
CPC . G01R 31/31703 (2013.01); G01R 31/31705 (2013.01)

(58) Field of Classification Search
CPC ........ G01R 31/31703; G01R 31/31705; G01R 31/3177; G06F 11/1012; G06F 11/1048; G06F 11/2205; G06F 11/25
See application file for complete search history.

(56) References Cited

U.S. PATENT DOCUMENTS

| 4,414,669 A | 11/1983 | Heckelman et al. |
| 4,569,049 A | 2/1986 | McNamara |
| 5,611,043 A | 3/1997 | Even et al. |
| 6,334,201 B1 | 12/2001 | Sawaguchi et al. |
| 6,591,390 B1 * | 7/2003 | Yagyu .................. H03M 13/09 714/755 |

(Continued)

FOREIGN PATENT DOCUMENTS

| JP | 10-3404 | 1/1998 |
| JP | 2003-46393 A | 2/2003 |

OTHER PUBLICATIONS

Non-Final Office Action issued by the U.S. Patent and Trademark Office in related U.S. Appl. No. 14/751,405, dated Feb. 23, 2017.

(Continued)

Primary Examiner — Marc M Duncan
(74) Attorney, Agent, or Firm — Fujitsu Patent Center

(57) ABSTRACT

A memory unit stores first and second code values calculated by encoding a first sequence, contained in a first word, and a remaining second sequence of a target sequence, and the number of bytes from a word start to a target sequence start. A code value calculating unit calculates a code value for each byte, based on signal sequence. A first sequence detecting unit detects the first sequence, by comparing the first code value with a difference between the code values at the last byte of a word and at the byte corresponding to the number of bytes. An expected value calculating unit calculates an expected code value at the target sequence end, based on the code value at detection of the first sequence and the second code value. A determination unit signals that the target sequence is detected, when the code value equals the expected value.

9 Claims, 23 Drawing Sheets

(56) References Cited

U.S. PATENT DOCUMENTS

| | | | |
|---|---|---|---|
| 8,060,800 B2* | 11/2011 | Goessel | G01R 31/31703 |
| | | | 714/732 |
| 9,720,037 B2* | 8/2017 | Ichiba | G01R 31/31705 |
| 2002/0144235 A1 | 10/2002 | Simmers | |
| 2003/0037257 A1 | 2/2003 | Wang | |
| 2007/0168732 A1 | 7/2007 | Liu et al. | |
| 2007/0226702 A1* | 9/2007 | Segger | G06F 11/3624 |
| | | | 717/130 |
| 2013/0346814 A1 | 12/2013 | Zadigian et al. | |
| 2016/0084906 A1* | 3/2016 | Tamiya | G01R 31/31705 |
| | | | 714/735 |

OTHER PUBLICATIONS

Notice of Allowance issued by the U.S. Patent and Trademark Office in related U.S. Appl. No. 14/751,405, dated Jun. 12, 2017. ** References cited in the Notice of Allowance were previously filed in the IDS.

Mathys Walma, "Pipelined Cyclic Redundancy Check (CRC) Calculation", Computer Communications and Networks, 2007. ICCCN 2007. Proceedings of 16th International Conference, pp. 365-370 (7 pages).

Non-Final Office Action issued by the U.S. Patent and Trademark Office in related U.S. Appl. No. 14/751,405, dated Nov. 4, 2016.

* cited by examiner

FIG. 10

| Byte offset | +0 | +1 | +2 | +3 | +4 | +5 | +6 | +7 |
|---|---|---|---|---|---|---|---|---|
| Word1 | Fmt | Fmt | attr | length | devid | devid | tag | be |
| Word2 | Addr | Addr | Addr | Addr | Data | Data | Data | Data |

FIG. 19

| Byte offset | −1 | +0 | +1 | +2 | +3 | +4 | +5 | +6 | +7 |
|---|---|---|---|---|---|---|---|---|---|
| CODE VALUE | a(j−1) | a(j) | a(j+1) | a(j+2) | a(j+3) | a(j+4) | a(j+5) | a(j+6) | a(j+7) |

Sa
Saa
Sab
Sac
Sad

FIG. 20

| Byte offset | −1 | +0 | +1 | +2 | +3 | +4 | +5 | +6 | +7 |
|---|---|---|---|---|---|---|---|---|---|
| CODE VALUE | a(j−1) | a(j) | a(j+1) | a(j+2) | a(j+3) | a(j+4) | a(j+5) | a(j+6) | a(j+7) |

SXa

SXb

SXc

SXd

FIG. 21

| Byte offset | −1 | +0 | +1 | +2 | +3 | +4 | +5 | +6 | +7 |
|---|---|---|---|---|---|---|---|---|---|
| CODE VALUE MULTIPLIED BY H(k) | H(8)·a(j−1) | H(7)·a(j) | H(6)·a(j+1) | H(5)·a(j+2) | H(4)·a(j+3) | H(3)·a(j+4) | H(2)·a(j+5) | H(1)·a(j+6) | a(j+7) |

SXa

SXb

SXc

SXd

DEBUG CIRCUIT, SEMICONDUCTOR DEVICE, AND DEBUG METHOD

CROSS-REFERENCE TO RELATED APPLICATION

This application is based upon and claims the benefit of priority of the prior Japanese Patent Application No. 2015-066456, filed on Mar. 27, 2015, the entire contents of which are incorporated herein by reference.

FIELD

The embodiments discussed herein relate to a debug circuit, a semiconductor device, and a debug method.

BACKGROUND

There is a logic analyzer method that debugs an actual device by inserting a debug circuit into a debug target circuit during its implementation in order to confirm whether or not the hardware operates normally.

In the logic analyzer method, the debug circuit monitors a temporal change of a signal of a debug target circuit which is specified by a user. Then, the debug circuit stops operation of the debug target circuit when the signal value satisfies a predetermined stop condition, and outputs the signal temporal change recorded in a trace memory to a display device or the like.

See, for example, Japanese Laid-open Patent Publication No. 2003-46393 and M. Walma, "Pipelined Cyclic Redundancy Check (CRC) Calculation", Proc. of 16th Int'l Conf. on Computer Communications and Networks, pp. 365-370, 2007.

In the meantime, when software is debugged, a program is stopped under various conditions by using a break point. However, when hardware is debugged, it is difficult to stop the hardware at conditions and time points desirable for a user because of hardware constraints, such as the capacity of a trace memory and the number of signal lines that can be used in debugging, and thus it is difficult to debug the hardware efficiently. Thus, a problem is to improve the work efficiency of debugging.

SUMMARY

According to one aspect, there is provided a debug circuit including: a memory unit configured to store a first code value calculated by encoding a first sequence, contained in a first word, of a detection target sequence, a second code value calculated by encoding a remaining second sequence of the detection target sequence, and a first byte number indicating the number of bytes from a starting point of the first word to a starting point of the detection target sequence, wherein the first code value and the second code value are calculated in accordance with an encoding method that calculates different values depending on a signal sequence in a circuit that processes word by word; a code value calculating unit configured to calculate a third code value for each byte of the signal sequence in accordance with the encoding method; a first sequence detecting unit configured to detect the first sequence on the basis of a comparison result between the first code value and a difference between a fourth code value at a last byte of the first word of the signal sequence and a fifth code value at a byte positioned according to the first byte number, wherein each of the fourth code value and the fifth code value is the third code value; an expected value calculating unit configured to calculate an expected value of the third code value at the end of the detection target sequence, on the basis of the second code value and a sixth code value obtained when the first sequence is detected, wherein the sixth code value is the third code value; and a determination unit configured to output a signal indicating that the detection target sequence is detected, when the third code value is equal to the expected value.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 10 illustrates an example of a packet;

FIG. 19 illustrates exemplary detection of a sequence Sa;

FIG. 20 illustrates an example of four sequences;

FIG. 21 illustrates an example of code values multiplied by H(k);

DESCRIPTION OF EMBODIMENTS

Figure 1:
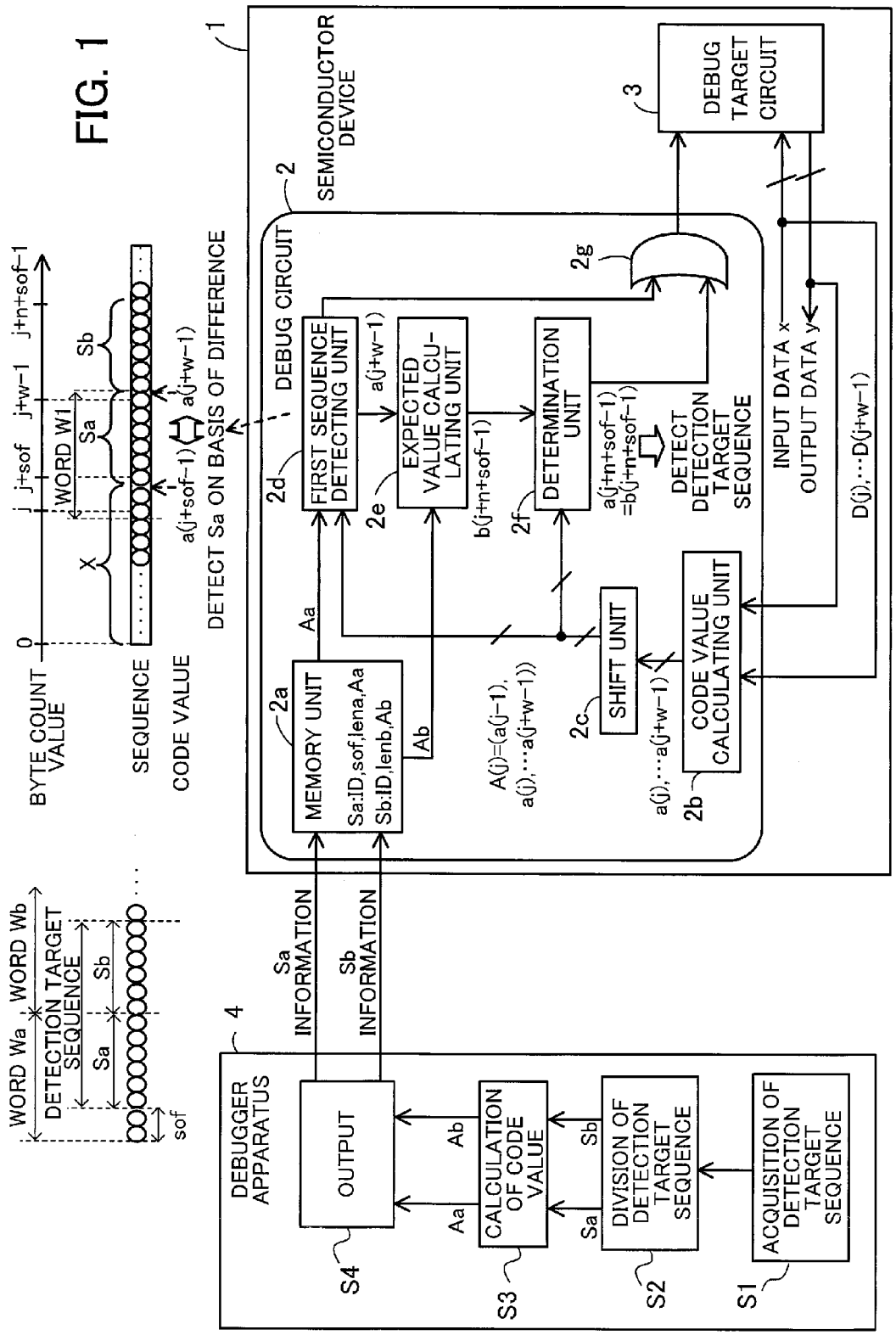
FIG. 1 illustrates an example of a semiconductor device, a debug circuit, and a debugger apparatus of a first embodiment.

Several embodiments will be described below with reference to the accompanying drawings, wherein like reference numerals refer to like elements throughout.

(First Embodiment)

FIG. 1 illustrates an example of a semiconductor device, a debug circuit, and a debugger apparatus of the first embodiment. A semiconductor device 1 includes a debug circuit 2 and a debug target circuit 3, which is hardware. The debug circuit 2 detects a predetermined signal sequence (hereinafter, referred to as a detection target sequence) from a signal sequence of the debug target circuit 3, and outputs a detection signal indicating such detection. The detection signal is used to stop the operation of the debug target circuit 3, for example. Note that the debug target circuit 3 performs data processing (parallel data processing) for each word consisting of a plurality of bytes.

The detection target sequence does not always start from the starting point of a word. For example, the debug target circuit 3 processes transaction layer packets of peripheral component interconnect (PCI) express, in which one word consists of 8 bytes. Each of these packets includes signal sequences indicating a packet type, a device number, a write address, or other information. These signal sequences do not always start from the starting point (boundary) of a word. The debug circuit 2 of the present embodiment can also set such signal sequences as detection targets.

FIG. 1 illustrates an example of a detection target sequence extending over words Wa and Wb. An ellipsoidal element represents a byte. There is an offset according to the number of bytes sof (2 in the example of FIG. 1) between the starting point of the word Wa (consisting of 8 bytes) and the starting point of the detection target sequence. FIG. 1 illustrates a sequence Sa (contained in the word Wa) that extends from the starting point of a detection target sequence to a boundary of the first word Wa, and a sequence Sb that is a remaining part of the detection target sequence.

The debug circuit 2 includes a memory unit 2a, a code value calculating unit 2b, a shift unit 2c, a first sequence detecting unit 2d, an expected value calculating unit 2e, a determination unit 2f, and an OR circuit 2g.

The memory unit 2a stores a code value Aa calculated by encoding the above sequence Sa and a code value Ab calculated by encoding the above sequence Sb. Also, the memory unit 2a stores the number of bytes sof (0 to w−1) (w is a word length). The memory unit 2a may also store the length lena of the sequence Sa, the length lenb of the sequence Sb, and the identification number ID of the detection target sequence, as illustrated in FIG. 1.

The code values Aa and Ab are calculated in accordance with an encoding method that changes the code values depending on signal sequence of the debug target circuit 3. The code values Aa and Ab have linearity (i.e., linear code) for example, and are calculated in the debugger apparatus 4 in accordance with an encoding method, such as cyclic redundancy check (CRC).

The code value calculating unit 2b acquires each word of a signal sequence of the debug target circuit 3, and calculates code values of respective bytes on the basis of the signal sequence, in accordance with the same encoding method as the encoding method used when the debugger apparatus 4 calculates the code values Aa and Ab. Note that the code value calculating unit 2b simultaneously calculates the code values of respective bytes in one word from data of the one word on the basis of equation (1) described later. Also, for example, the code value calculating unit 2b includes a counter (not depicted) which serves to count the number of bytes included in acquired data.

FIG. 1 illustrates an example in which the code value calculating unit 2b acquires one word data D(j), . . . , D(j+w−1) from input data x or output data y of signals of the debug target circuit 3. Here, j represents a count value of bytes acquired by the code value calculating unit 2b, and D(j) represents data of j-th byte. Also, w represents the number of bytes included in one word, and means a word length. Upon acquiring the data D(j), . . . , D(j+w−1), the code value calculating unit 2b calculates code values a(j), . . . , a(j+w−1).

The shift unit 2c adds the code value at the last byte of a previous word that is one word before a word processed by the code value calculating unit 2b, to the top of the code values of the word processed by the code value calculating unit 2b, and supplies it to the first sequence detecting unit 2d. In the example illustrated in FIG. 1, the code value a(j−1) at the last byte of the previous word that is one word before a word processed by the code value calculating unit 2b is added to the code values a(j), . . . , a(j+w−1) of the word processed by the code value calculating unit 2b, and is supplied to the first sequence detecting unit 2d as A(j).

The first sequence detecting unit 2d detects the sequence Sa of the detection target sequence, on the basis of a comparison result between the code value Aa and a difference between two code values calculated by the code value calculating unit 2b: the code value at the last byte of the word and the code value at the byte positioned according to the aforementioned number of bytes sof.

FIG. 1 illustrates exemplary detection of the sequence Sa when the detection target sequence including the sequences Sa and Sb follows an unknown sequence X. The sequence Sa is included in a word W1. The start position of the sequence Sa in the word W1 corresponds to the number of bytes sof, and is of a byte count value j+sof in the example of FIG. 1. Also, the position of the last byte of the word W1 is of a byte count value j+w−1.

In this case, the code value Aa is equal to the difference between the code value a(j+w−1) at the last byte of the word W1 and the code value a(j+sof−1) at the byte that is one byte before the byte count value j+sof. Hence, the first sequence detecting unit 2d detects the sequence Sa. Upon detecting the sequence Sa, the first sequence detecting unit 2d supplies the code value obtained when the sequence Sa is detected, to the expected value calculating unit 2e. In the example of FIG. 1, the code value a(j+w−1) is supplied to the expected value calculating unit 2e.

Note that, the first sequence detecting unit 2d also has a function for detecting a detection target sequence that is entirely contained in the word W1. This process will be described later.

The expected value calculating unit 2e calculates an expected value of the code value that the code value calculating unit 2b calculates at the end of the detection target sequence, on the basis of the code value Ab and the code value obtained when the sequence Sa is detected, which is one of the code values calculated by the code value calculating unit 2b. For example, if the code value obtained when the sequence Sa is detected is the code value a(j+w−1), the expected value calculating unit 2e calculates an expected value b(j+n+sof−1) based on XOR calculation between the code value a(j+w−1) and the code value Ab (refer to below equation (5)). Here, n is the length (number of bytes) of the detection target sequence.

The determination unit 2f outputs a signal indicating that the detection target sequence is detected, when the code value output from the code value calculating unit 2b is equal to the expected value. In the example illustrated in FIG. 1, the code value a(j+n+sof−1) output from the code value calculating unit 2b is equal to the expected value b(j+n+sof−1). In this case, the determination unit 2f outputs a signal indicating that the detection target sequence is detected. This signal is a circuit stop signal that instructs a stop of operation of the debug target circuit 3, for example.

For example, the determination unit 2f outputs the circuit stop signal to stop the supply of clock signals to the debug target circuit 3, in order to stop the operation of the debug target circuit 3. Also, the determination unit 2f may cut off data input to the debug target circuit 3 or data output from the debug target circuit 3, so that the debug target circuit 3 is treated as being stopped.

The debugger apparatus 4 performs debugging by communicating with the semiconductor device 1. The debugger apparatus 4 is a computer that executes the following process with software, for example. The debugger apparatus 4 first acquires a detection target sequence from a user (a debugging operator) (step S1). Thereafter, the debugger apparatus 4 divides the detection target sequence into two sequences Sa and Sb at the boundary of the word Wa (step S2), and calculates the code values Aa and Ab by encoding the sequences Sa and Sb (step S3). Then, the debugger apparatus 4 outputs (transmits), to the semiconductor device 1, information of the sequences Sa and Sb including the calculated code values Aa and Aa and the number of bytes sof (step S4). Note that, when the detection target sequence is entirely contained in the word Wa, the sequence Sa is the detection target sequence, and the sequence Sb is not included.

The following description explains an example of a debug method by a debug system including the semiconductor device 1 and the debugger apparatus 4. The information of sequences Sa and Sb, which is calculated and transmitted in the process of the above steps S1 to S4 by the debugger apparatus 4, is stored in the memory unit 2a of the debug circuit 2 of the semiconductor device 1.

The debug circuit 2 continuously detects signals of the debug target circuit 3, and the code value calculating unit 2b updates code values word by word on the basis of a sequence of input data x or output data y, in the example of FIG. 1. For example, as in FIG. 1, when the debug circuit 2 acquires data D(j), . . . , D(j+w−1) of one word from the debug target circuit 3, the output of the code value calculating unit 2b is updated to the code values a(j), . . . , a(j+w−1). The shift unit 2c adds the code value a(j−1) to the code values a(j), . . . , a(j+w−1) output from the code value calculating unit 2b, and thereafter supplies those code values to the first sequence detecting unit 2d.

In order for the debug circuit 2 to detect the above detection target sequence including sequences Sa and Sb, the first sequence detecting unit 2d receives the code values a(j−1), a(j), . . . , a(j+w−1) and the code value Aa, and detects the sequence Sa by the above method. Then, the first sequence detecting unit 2d supplies the code value a(j+w−1) obtained when the sequence Sa is detected, to the expected value calculating unit 2e. The expected value calculating unit 2e calculates the aforementioned expected value b(j+n+sof−1) on the basis of the code value a(j+w−1) and the code value Ab.

As the input data x or the output data y changes, the code value a(j+n+sof−1) output from the code value calculating unit 2b becomes equal to the expected value b(j+n+sof−1). Then, the determination unit 2f outputs a signal indicating that the detection target sequence is detected. In this case, the determination unit 2f outputs "1", for example. Thereby, the OR circuit 2g outputs "1", and stops the operation of the debug target circuit 3, for example. Thereafter, the debugger apparatus 4 performs a debugging operation, such as checking signals of each unit of the debug target circuit 3, for example.

Figure 2:
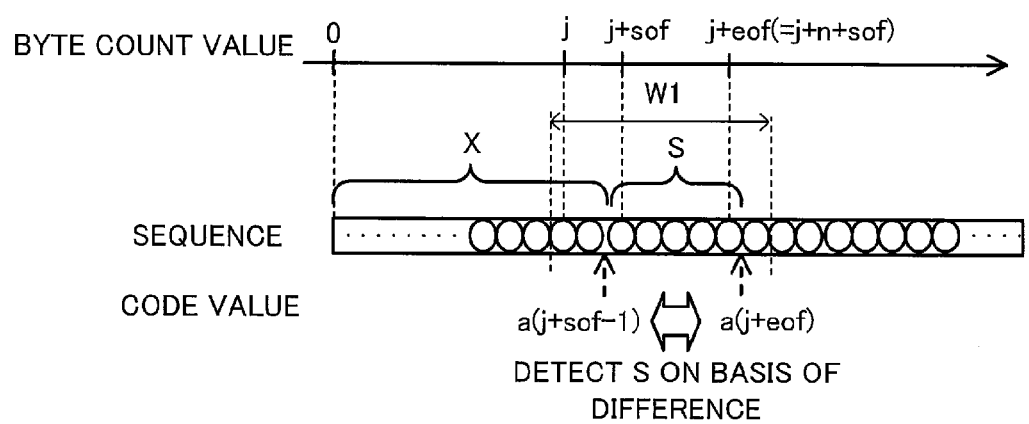
FIG. 2 is a diagram for describing a detection process when a detection target sequence is contained in one word.

The debug circuit 2 executes the following process to detect a detection target sequence that is entirely contained in the word W1. FIG. 2 is a diagram for describing a detection process for a detection target 6 sequence that is entirely contained in one word.

As illustrated in FIG. 2, when the detection target sequence S is entirely contained in the word W1, the first sequence detecting unit 2d detects the detection target sequence S on the basis of a comparison result between the code value Aa and the difference between the aforementioned code value a(j+sof−1) and the code value a(j+eof). Here, the number of bytes eof is calculated by adding the number of bytes sof and the number of bytes n of the detection target sequence.

When the difference between the code value a(j+sof−1) and the code value a(j+eof) is equal to the code value Aa, the first sequence detecting unit 2d outputs "1" as a signal indicating that the detection target sequence S is detected, for example. In this case as well, the OR circuit 2g outputs "1" to stop the operation of the debug target circuit 3, for example.

As described above, the debug circuit 2 of the present embodiment stores the number of bytes from the starting point of a word to the starting point of a detection target sequence, and detects the detection target sequence by using the code value at the byte positioned according to the number of bytes. Thereby, a detection target sequence can be set, regardless of word boundary. That is, a signal sequence that does not start from the starting point of a word can be set as a detection target sequence. For example, even when a word includes a field that contains a value that varies depending on operation environment, a detection target sequence can be set, avoiding such a field. Thereby, the hardware is stopped at conditions and time points intended by a user, in order to improve work efficiency of debugging.

Also, despite hardware constraints, the debug target circuit 3 can be stopped easily in various conditions, by using code values, in order to increase the work efficiency of debugging.

Also, the debug circuit 2 does not handle the input data x and the output data y directly, but executes the process by using code values of small data amount, so that the process is executed in a small scale circuit at a high speed.

Further, even when a detection target sequence is complicated, the sequence is expressed as code values, and therefore the capacity of the memory unit 2a can be small, and the circuit areas of the debug circuit 2 and the semiconductor device 1 can be small.

Also, detection target sequences are changed by storing code values calculated by encoding a new detection target sequence in the memory unit 2a, and therefore the circuit is needless to be reimplemented, and the work efficiency of debugging is improved.

(Second Embodiment)

Figure 3:
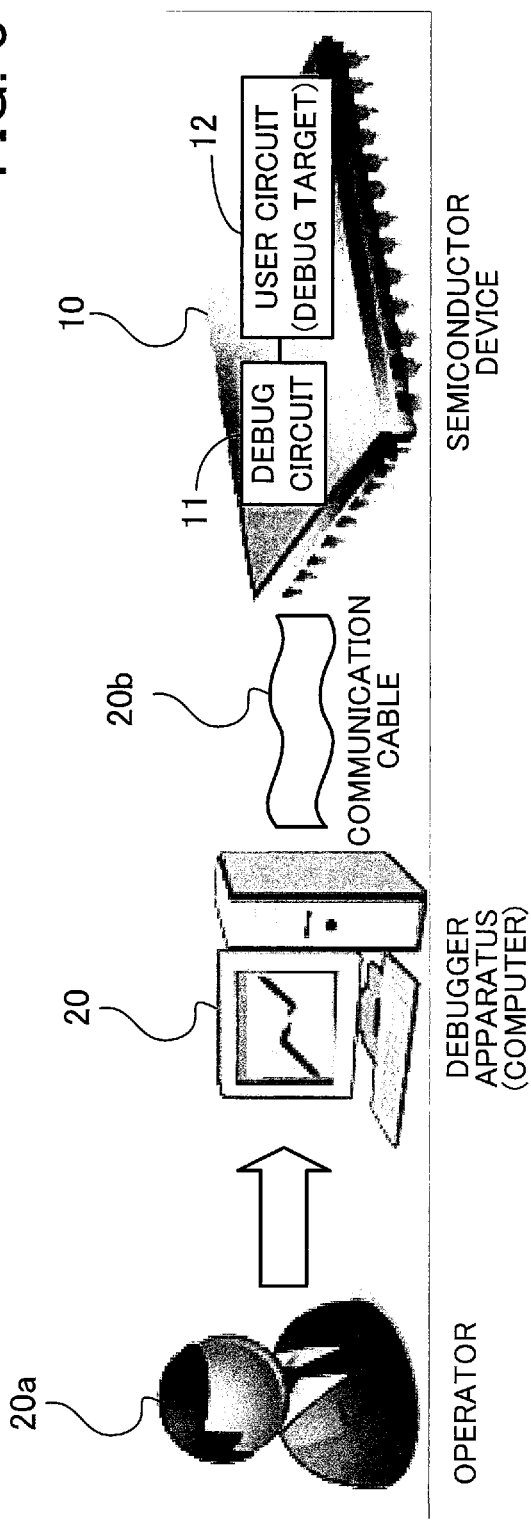
FIG. 3 illustrates an example of a debug system including a semiconductor device and a debugger apparatus of a second embodiment.

FIG. 3 illustrates an example of a debug system including a semiconductor device and a debugger apparatus of the second embodiment. The debug system includes a semiconductor device 10 and a debugger apparatus 20, which are interconnected by a communication cable 20b. Note that the semiconductor device 10 and the debugger apparatus 20 may communicate wirelessly with each other. The semiconductor device 10 is a system on chip (SoC) for example, and includes a debug circuit 11 and a user circuit 12 of debug target. The debugger apparatus 20 is a computer that is handled by an operator 20a for example, and communicates with the semiconductor device 10 via the communication cable 20b to execute a debug process.

(Semiconductor Device)

Figure 4:
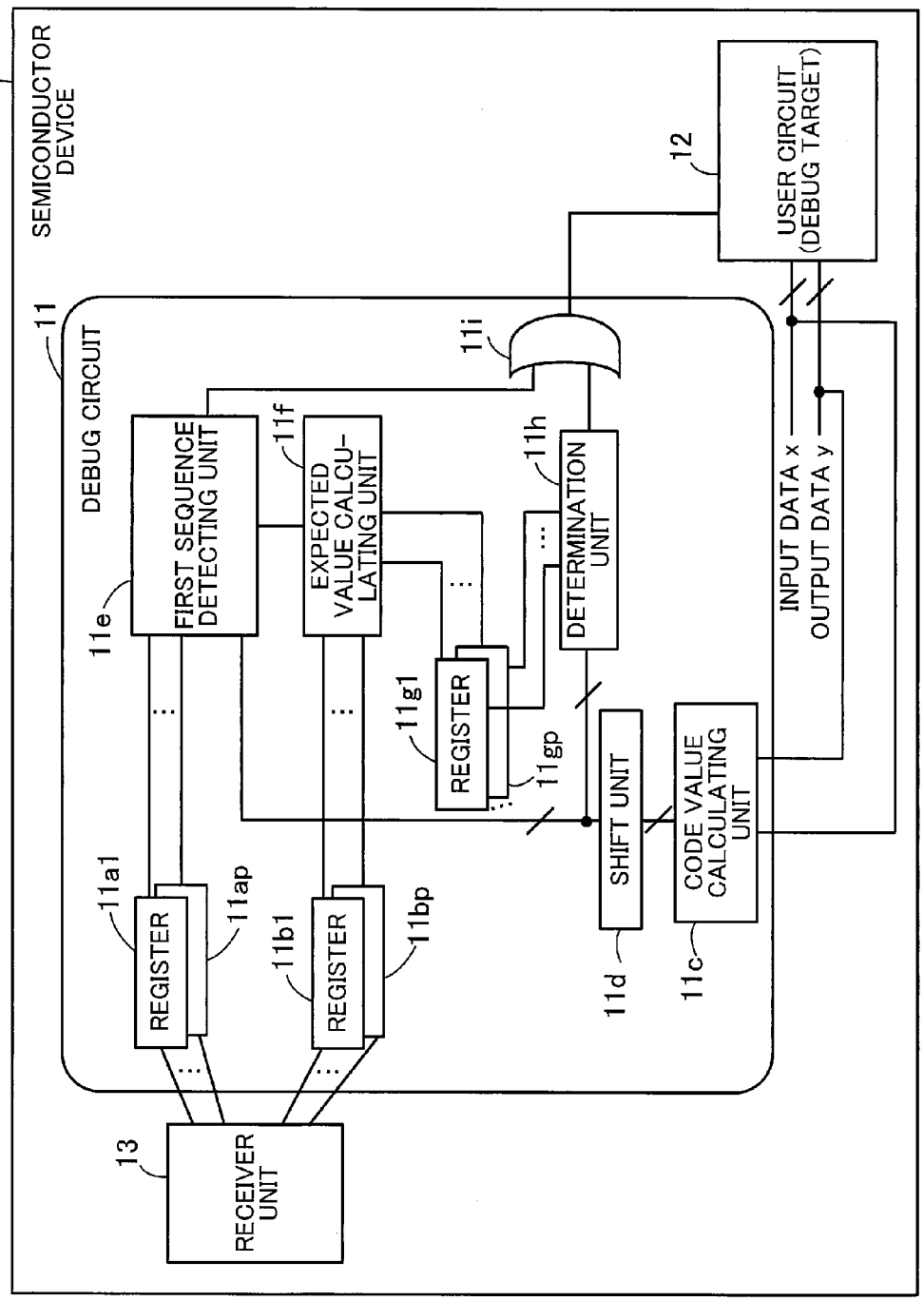
FIG. 4 illustrates an example of a semiconductor device.

FIG. 4 illustrates an example of the semiconductor device. The semiconductor device 10 includes a receiver unit 13 that receives data supplied from the debugger apparatus 20 via the communication cable 20b, in addition to the aforementioned debug circuit 11 and the user circuit 12.

The debug circuit 11 includes registers 11a1 to 11ap, registers 11b1 to 11bp, a code value calculating unit 11c, a shift unit 11d, a first sequence detecting unit 11e, an expected value calculating unit 11f, registers 11g1 to 11gp, a determination unit 11h, and an OR circuit 11i.

The registers 11a1 to 11ap and the registers 11b1 to 11bp have a function of the memory unit 2a in the debug circuit 2 of the first embodiment. A random access memory (RAM) may be used, instead of the registers 11a1 to 11ap and the registers 11b1 to 11bp.

In the second embodiment, there are a plurality (p pieces) of detection target sequences. Each of the registers 11a1 to 11ap stores a code value calculated by encoding a part of a corresponding detection target sequence that starts from its starting point and is contained in the first word, and information of the number of bytes from the starting point of a word to the starting point of the detection target sequence. In the following, a part of a detection target sequence that is contained in the first word is represented by a sequence Sa in the same way as the first embodiment.

Each of the registers 11b1 to 11bp stores a code value calculated by encoding a remaining sequence of a corresponding detection target sequence, and information of the remaining sequence. In the following, this sequence is represented by a sequence Sb in the same way as the first embodiment. Also, in the following, code values are encoded by CRC, but are not limited thereto. Code values having linearity can be employed, for example.

Figure 5:
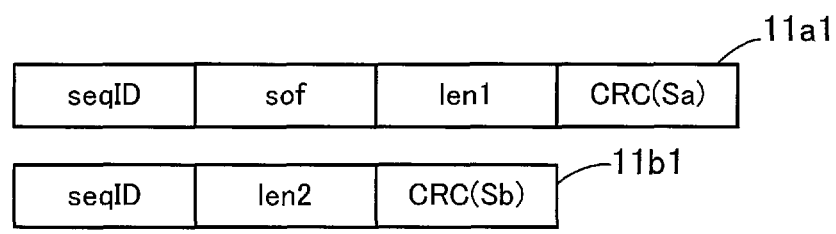
FIG. 5 illustrates a data containment example of registers.

FIG. 5 illustrates a data containment example of registers. The register 11a1 stores an identifier seqID of a detection target sequence, the number of bytes sof from the starting point of a word to the starting point of the detection target sequence, a length len1 of a sequence Sa, and a code value CRC(Sa) of the sequence Sa. The register 11b1 stores the identifier seqID of the detection target sequence, a length len2 of a sequence Sb, and a code value CRC(Sb) of the sequence Sb.

The identifier seqID is used to indicate that the code values CRC(Sa) and CRC(Sb) belong to in the same detection target sequence. The length len1 of the sequence Sa indicates the number of bytes and is one of w−sof and the length n of the detection target sequence. Note that w represents a word length in terms of the number of bytes. The length len2 of the sequence Sb is calculated by n−w+sof.

Note that a detection target sequence specifies a transition pattern of a signal of the user circuit 12, for the purpose of stopping the user circuit 12, for example. The signal of the user circuit 12 is input data, output data, or an internal signal of the user circuit 12, for example. In the following, a detection target sequence is described as a transition pattern of one signal (for example, input data or output data), but may be transition patterns of a plurality of signals. Also, the user circuit 12 performs data processing word by word.

The code value calculating unit 11c acquires each word of a signal sequence of the user circuit 12, and calculates a code value, which vary depending on sequence, for each byte by the same encoding method as the encoding method used when calculating code values in the debugger apparatus 20 (i.e., CRC). Note that the code value calculating unit 11c includes a counter (not depicted) which serves to count the number of bytes included in acquired data.

For example, the code value calculating unit 11c simultaneously calculates code values of one word from the data of the one word on the basis of the following equation (1).

$$\begin{bmatrix} a(j+w-1) \\ \vdots \\ a(j) \end{bmatrix} = \begin{pmatrix} H(1) & H(2) & \dots & H(w) \\ 0 & H(1) & \ddots & \vdots \\ \vdots & & \ddots & H(2) \\ \emptyset & \dots & 0 & H(1) \end{pmatrix} \begin{bmatrix} D(j+w-1) \\ \vdots \\ D(j) \end{bmatrix} \quad (1)$$

In equation (1), j represents a count value of bytes, and w represents a word length. Also, D(j) to D(j+w−1) are data of one word acquired by the code value calculating unit 11c, and a(j) to a(j+w−1) are code values of one word calculated by the code value calculating unit 11c. H(k) (k=1 to w) represents a Hamming matrix. H(k) is a regular matrix that converts CRC values in such a manner to bring the same effect as &$0^k$ (where & represents concatenation of sequence, and $0^k$ represents a signal sequence value that is 0 of k bytes). An example of CRC calculation using a Hamming matrix is described in M. Walma, "Pipelined Cyclic Redundancy Check (CRC) Calculation", Proc. of 16th Int'l Conf. on Computer Communications and Networks, pp. 365-370, 2007, for example.

The shift unit 11d adds the code value at the last byte of the previous word that is one word before a word processed by the code value calculating unit 11c, to the top of the code values of the word processed by the code value calculating unit 11c, and supplies it to the first sequence detecting unit 11e.

Figure 6:
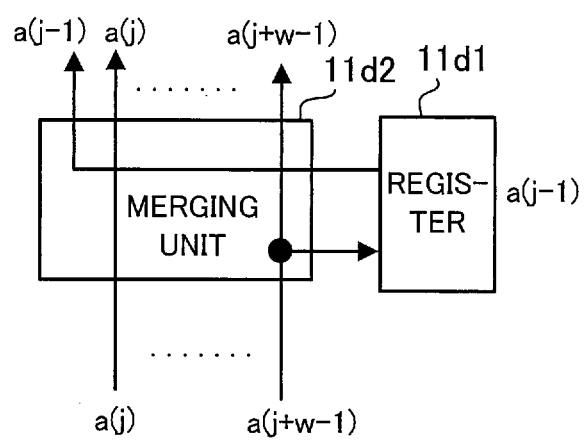
FIG. 6 illustrates an example of a shift unit.

FIG. 6 illustrates an example of the shift unit. The shift unit 11d includes a register 11d1 and a merging unit 11d2. The register 11d1 stores the last code value of code values of one word. The merging unit 11d2 merges and outputs the code value stored in the register 11d1, when code values of one word are input. In the example of FIG. 6, when code values a(j) to a(j+w−1) of one word are input, the merging unit 11d2 merges the code values a(j) to a(j+w−1) and the code value a(j−1) at the last byte of the previous word which is stored in the register 11d1. That is, the merging unit 11d2 outputs the code values a(j−1) and a(j) to a(j+w−1).

In FIG. 4, the first sequence detecting unit 11e detects a sequence Sa on the basis of a comparison result between the code values stored in the registers 11a1 to 11ap and the difference between the code value at the last byte in a certain word and the code value at the byte positioned according to the number of bytes sof. Also, upon detecting the sequence Sa, the first sequence detecting unit 11e supplies the code value obtained when the sequence Sa is detected, to the expected value calculating unit 11f. Note that the first sequence detecting unit 11e also has a function for detecting a detection target sequence that is entirely contained in one word.

The expected value calculating unit 11f calculates an expected value of the code value that the code value calculating unit 11c calculates at the end of a detection target sequence, on the basis of the code value obtained when a sequence Sa is detected and the code values stored in the registers 11b1 to 11bp. The registers 11g1 to 11gp stores expected values corresponding to detection target sequences, which are calculated by the expected value calculating unit 11f.

Figure 7:
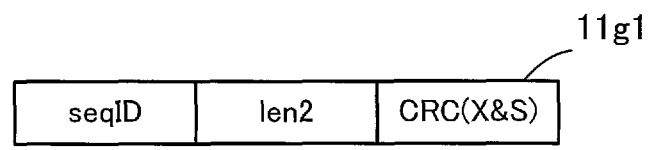
FIG. 7 illustrates an example of an expected value contained in a register.

FIG. 7 illustrates an example of an expected value contained in a register. The register 1191 stores an identifier seqID of a detection target sequence S, a length len2 of a sequence Sb, and a code value CRC(X&S). Note that X is an unknown sequence, and the code value CRC(X&S) represents an expected value of the code value obtained when the detection target sequence S follows the unknown sequence.

The determination unit 11h compares a code value output from the shift unit 11d (a code value updated consecutively from byte count value 0 (hereinafter, sometimes referred to as an absolute value of a code value)) with the expected values stored in the registers 11g1 to 11gp. Then, the determination unit 11h outputs a 6 signal indicating that a detection target sequence is detected, when the absolute value of the code value is equal to one of the expected values stored in the registers 11g1 to 11gp, in order to stop the operation of the user circuit 12 of debug target, for example.

The OR circuit 11i outputs "1", when a detection target sequence that is entirely contained in a word length is detected by the first sequence detecting unit 11e, or when a detection target sequence that exceeds a word length is detected by the determination unit 11h. Exemplary processes of the first sequence detecting unit 11e, the expected value calculating unit 11f, and the determination unit 11h will be described later.

(Debugger Apparatus 20)

Figure 8:
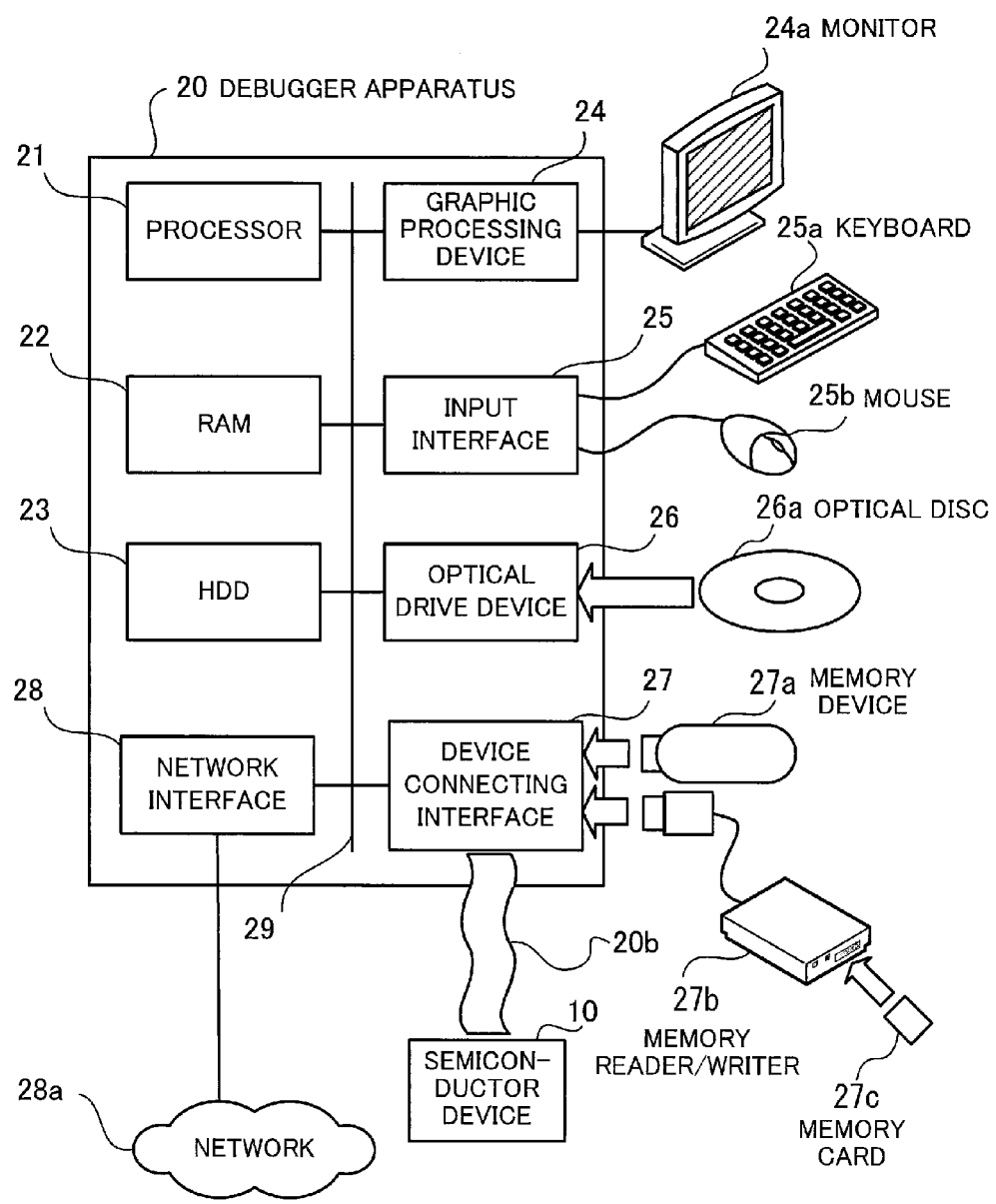
FIG. 8 illustrates exemplary hardware of a debugger apparatus.

FIG. 8 illustrates exemplary hardware of the debugger apparatus. The debugger apparatus 20 is a computer, and the entire apparatus is controlled by a processor 21. A RAM 22 and a plurality of peripheral devices are connected to the processor 21 via a bus 29. The processor 21 may be a multiprocessor. The processor 21 may be a central processing unit (CPU), a micro processing unit (MPU), a digital signal processor (DSP), an application specific integrated circuit (ASIC), or a programmable logic device (PLD), for example. Also, the processor 21 may be a combination of two or more elements of a CPU, an MPU, a DSP, an ASIC, and a PLD.

The RAM 22 is used as a main memory device of the debugger apparatus 20. At least a part of an operating system (OS) program and application programs executed by the processor 21 is temporarily stored in the RAM 22. Also, various types of data is stored in the RAM 22 to be processed by the processor 21.

The peripheral devices connected to the bus 29 are a hard disk drive (HDD) 23, a graphic processing device 24, an input interface 25, an optical drive device 26, a device connecting interface 27, and a network interface 28.

The HDD 23 writes data into and reads data from an internal disk magnetically. The HDD 23 is used as an auxiliary memory device of the debugger apparatus 20. The OS program, the application programs, and various types of data are stored in the HDD 23. Note that the auxiliary memory device may be a semiconductor memory device, such as a flash memory.

A monitor 24a is connected to the graphic processing device 24. The graphic processing device 24 displays an image, such as a debug result, on the screen of the monitor 24a in accordance with a command from the processor 21. The monitor 24a is a liquid crystal display device or a display device using a cathode ray tube (CRT), for example.

A keyboard 25a and a mouse 25b are connected to the input interface 25. The input interface 25 receives signals from the keyboard 25a and the mouse 25b and 6 supplies them to the processor 21. Note that the mouse 25b is an example of a pointing device, and other pointing devices may be used. Other pointing devices are, for example, a touch panel, a tablet, a touch pad, and a trackball.

The optical drive device 26 reads data from an optical disc 26a, utilizing laser light or the like. The optical disc 26a is a portable storage medium in which data is stored in a readable manner by reflection of light. The optical disc 26a is, for example, a digital versatile disc (DVD), a DVD-RAM, a compact disc read only memory (CD-ROM), or a CD-R(Recordable)/RW(ReWritable).

The device connecting interface 27 is a communication interface for connecting peripheral devices to the debugger apparatus 20. For example, a memory device 27a and a memory reader/writer 27b may be connected to the device connecting interface 27. The memory device 27a is a storage medium having a function for communicating with the device connecting interface 27. The memory reader/writer 27b is a device for writing data into or reading data from a memory card 27c. The memory card 27c is a card storage medium.

Also, the device connecting interface 27 is connected to the semiconductor device 10 via the communication cable 20b. The network interface 28 is connected to a network 28a. The network interface 28 transmits data to and receives data from another computer or a communication device via the network 28a.

The above hardware configuration provides the processing function of the debugger apparatus 20 of the second embodiment. Note that the debugger apparatus 4 of the first embodiment is also configured with the same hardware as the debugger apparatus 20 illustrated in FIG. 8.

The debugger apparatus 20 provides the processing function of the second embodiment by executing a program stored in a computer-readable storage medium, for example. A program describing a procedure executed by the debugger apparatus 20 may be stored in various storage media. For example, the program executed by the debugger apparatus 20 may be stored in the HDD 23. The processor 21 loads at least a part of the program from the HDD 23 into the RAM 22 and executes the program. Also, the program executed by the debugger apparatus 20 may be stored in a portable storage medium, such as the optical disc 26a, the memory device 27a, or the memory card 27c. The program stored in the portable storage medium becomes executable after installed in the HDD 23, by the control from the processor 21, for example. Also, the processor 21 may read the program directly from the portable storage medium and execute it.

(Debug Method)

In the following, an example of a debug method using the above semiconductor device 10 and the debugger apparatus 20 will be described.

Figure 9:
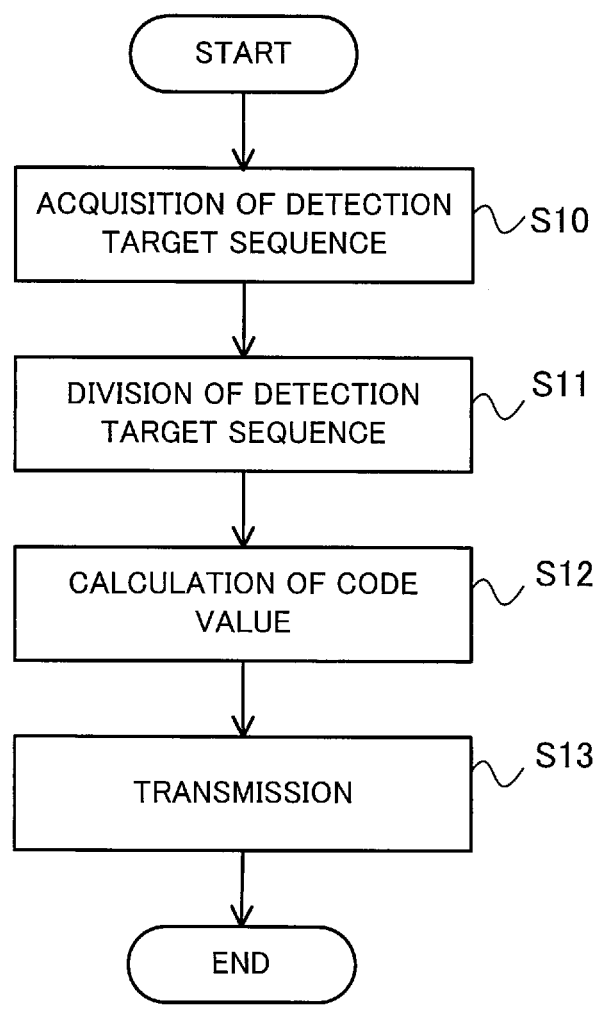
FIG. 9 is a flowchart illustrating an exemplary procedure of a setting process by a debugger apparatus.

FIG. 9 is a flowchart illustrating an exemplary procedure of a setting process by the debugger apparatus. The debugger apparatus 20 acquires one or a plurality of detection target sequences that the operator 20a inputs by operating the keyboard 25a and the mouse 25b, for example (step S10). A detection target sequence does not always start from the starting point of a word. For example, the user circuit 12 processes transaction layer packets of PCI express, in which one word consists of 8 bytes.

FIG. 10 illustrates an example of a packet. For example, fields of packet type (Pmt), device number (devid), write address (Addr) are specified as detection target sequences in the words (Word1, Word2) illustrated in FIG. 10. Attribute (attr), length (length), and write value (Data) varies depending on operation environment for example, and thus are not specified as detection target sequences.

For example, when a specific device number is to be detected, the "Byte offset" of devid is +4, in other words, devid starts from 5th byte, and thus the detection target sequence starts from the 5th byte in Word1.

After acquiring a detection target sequence, the debugger apparatus 20 divides the detection target sequence into a sequence Sa and a remaining sequence Sb, when the detection target sequence is not contained in one word (step S11).

Further, the debugger apparatus 20 calculates code values by encoding the sequence Sa and the sequence Sb by CRC (step S12). In the process of step S12, the debugger apparatus 20 calculates a code value from the start of the signal sequence Sa (input data or output data), and updates the code value on the basis of subsequent signals. The code value updated by the last signal of the sequence Sa is the code value of the sequence Sa. The subsequent sequence Sb is processed in the same way to calculate its code value.

The debugger apparatus 20 transmits to the semiconductor device 10 the code values calculated in the process of step S12, as well as an identification number of the detection target sequence, the number of bytes sof from the starting point of a word to the starting point of the detection target sequence, and lengths of the sequences Sa and Sb, (step S13). Thereafter, setting process by the debugger apparatus 20 ends.

Figure 11:
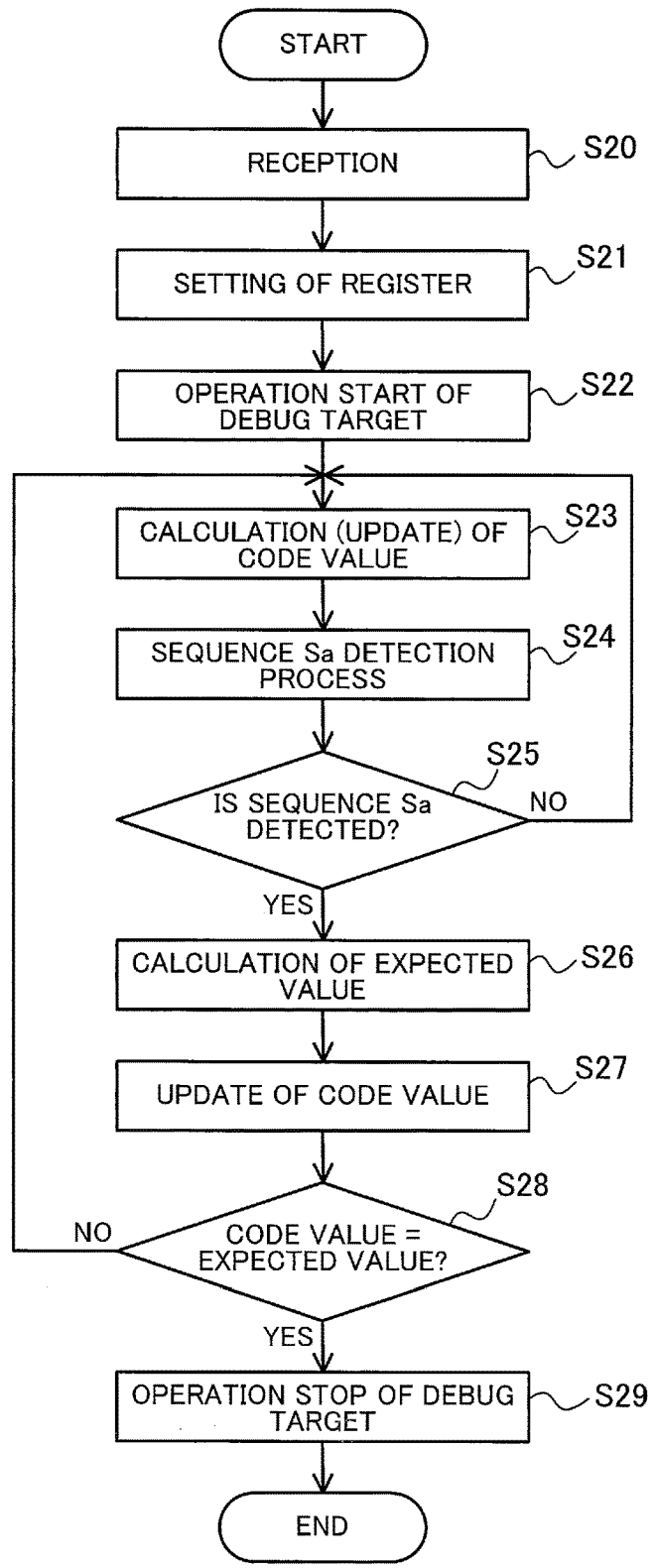
FIG. 11 is a flowchart illustrating an exemplary process procedure of a semiconductor device.

FIG. 11 is a flowchart illustrating an exemplary process procedure of the semiconductor device. The receiver unit 13 of the semiconductor device 10 receives information such as code values transmitted from the debugger apparatus 20 (step S20). Then, a control unit (not depicted) of the semiconductor device 10 sets (stores) the received information in the registers 11$a$1 to 11$ap$ and 11$b$1 to 11$bp$, as illustrated in FIG. 5 (step S21). Thereafter, the control unit of the semiconductor device 10 causes the user circuit 12 of debug target to start its operation (step S22). After the user circuit 12 starts the operation, the code value calculating unit 11$c$ of the debug circuit 11 calculates (updates) the code value by CRC at each time point of a clock (not depicted) on the basis of input data x or output data y of the user circuit 12 (step S23). In this case, the code value calculating unit 11$c$ calculates code values for each word in accordance with aforementioned equation (1). Thereafter, the first sequence detecting unit 11$e$ reads information from the registers 11$a$1 to 11$ap$ and detects a sequence Sa (step S24).

Figure 12:
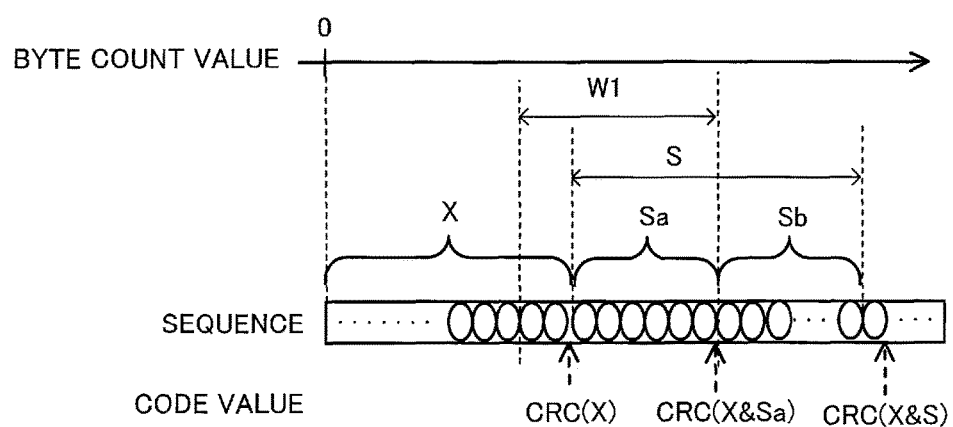
FIG. 12 illustrates an example of a user circuit signal that changes with a sequence including a detection target sequence that is not contained in one word.

The first sequence detecting unit 11$e$ executes the following process when a detection target sequence is not contained in one word (i.e., n>w−sof). FIG. 12 illustrates an example of a user circuit signal that changes with a sequence including a detection target sequence that is not contained in one word. In the example of FIG. 12, a sequence starts from byte count value 0. A certain sequence X is followed by a detection target sequence S. Also, in the example of FIG. 12, a code value is calculated by the code value calculating unit 11$c$. CRC(X) is the code value calculated at the ending point of the sequence X, and CRC(X&Sa) is the code value calculated at the ending point of the sequence Sa that starts from middle of the word W1, and CRC(X&S) is the code value calculated at the ending point of the sequence Sb (arbitrary length). Note that the linearity of CRC allows the following equation.

$$CRC(X \& S) = \\ CRC((X \& 0^m) + (0^k \& Sa)) = CRC(X \& 0^m) + CRC(0^k \& Sa) = \\ CRC(X \& 0^m) + CRC(Sa) = H(m) \cdot CRC(X) + CRC(Sa)$$ (2)

In equation (2), "+" represents XOR calculation (which is same in the following equations). Also, "$0^m$" represents a data sequence acquired from the user circuit 12, which consists of m bytes of consecutive 0s. Also, when the length of the sequence X is k bytes, "$0^k$" represents a signal sequence of the user circuit 12, which consists of k bytes of consecutive 0s. Also, in equation (2), CRC(X&$0^m$)+CRC($0^k$&Sa)=CRC(X&$0^m$)+CRC(Sa) is established, because consecutive 0s from an initial state do not affect a CRC value because of the nature of CRC, regardless of the number of 0s.

The first sequence detecting unit 11$e$ evaluates whether or not the following conditional equation is satisfied on the basis of the difference between two code values supplied from the shift unit 11$d$: the code value at the last byte of a word and the code value at the byte that is sof−1 bytes after the starting byte of the word.

$$a(j+w-1) - H(w-sof) \cdot a(j+sof-1) = CRC(Sa)$$ (3)

Here, j represents the number of bytes (byte count value) at the starting byte of a word. The first sequence detecting unit 11$e$ determines whether or not equation (3) based on the above CRC difference (change in the code value encoded by CRC) is satisfied, in order to determine whether or not the sequence Sa is detected (step S25).

Figure 13:
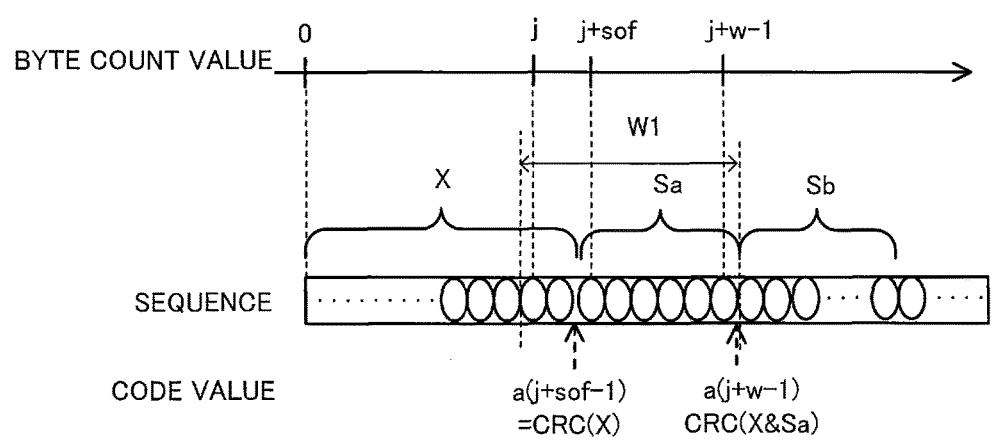
FIG. 13 illustrates exemplary detection of a sequence Sa.

FIG. 13 illustrates exemplary detection of the sequence Sa. In the example of FIG. 13, j represents the byte count value at the starting byte of the word W1. As illustrated in FIG. 13, when equation (3) is satisfied, the code value a(j+sof−1) is CRC(X), and the code value a(j+w−1) is C(X&Sa), and thus the sequence Sa is detected when the byte count value is j+w−1. Hence, when above equation (3) is satisfied, the first sequence detecting unit 11$e$ determines that the sequence Sa is detected, and sends the code value a(j+w−1) obtained when the byte count value is j+w−1, to the expected value calculating unit 11$f$.

Figure 14:
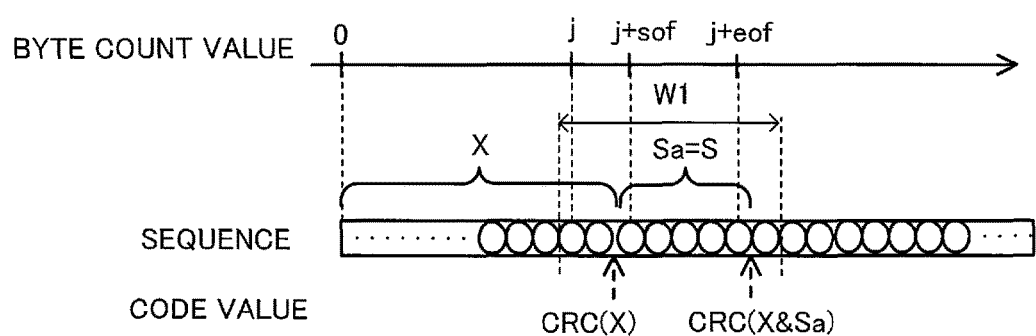
FIG. 14 illustrates an example of a user circuit signal that changes with a sequence including a detection target sequence that is entirely contained in one word.

On the other hand, when a detection target sequence is entirely contained in one word (i.e., n≤w−sof), the first sequence detecting unit 11$e$ executes the following process in the process of step S24. FIG. 14 illustrates an example of a user circuit signal that changes with a sequence including a detection target sequence that is entirely contained in one word. In the example of FIG. 14, the sequence starts from byte count value 0. As opposed to FIGS. 12 and 13, in the example of FIG. 14, a certain sequence X is followed by a detection target sequence S that is entirely contained in the word W1. In this case, the sequence Sa is identical with the detection target sequence S. FIG. 14 also illustrates an example of code values calculated by the code value calculating unit 11$c$. CRC(X) is the code value calculated at the ending point of the sequence X, and CRC(X&Sa) is the code value calculated at the ending point of the sequence Sa (the detection target sequence S).

The first sequence detecting unit 11$e$ evaluates whether or not the next conditional equation is satisfied when n is equal to or smaller than w−sof.

$$a(j+eof) - H(eof-sof+1) \cdot a(j+sof-1) = CRC(Sa)$$ (4)

In equation (4), eof is the number of bytes from the starting byte of a word to the last byte of a detection target sequence S. When the byte count value in the starting point of the word is j, the byte count value at the ending point of the detection target sequence S is j+eof. The first sequence detecting unit 11e determines whether or not equation (4) based on the above CRC difference (change in the code value encoded by CRC) is satisfied, in order to detect the detection target sequence S that is entirely contained in a word.

Figure 15:
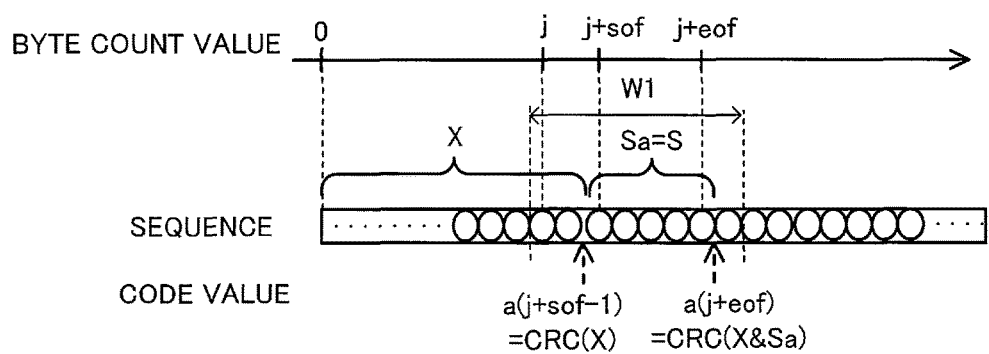
FIG. 15 illustrates exemplary detection of a detection target sequence S that is entirely contained in a word.

FIG. 15 illustrates exemplary detection of a detection target sequence S that is entirely contained in a word. As illustrated in FIG. 15, when equation (4) is satisfied, the code value a(j+sof−1) is CRC(X), and the code value a(j+eof) is CRC(X&Sa). Hence, when the byte count value is j+eof, a sequence Sa, which is the detection target sequence S in this case, is detected.

Although not illustrated in the flowchart of FIG. 11, when above equation (4) is satisfied, the first sequence detecting unit 11e determines that a detection target sequence S is detected, and outputs a signal "1" to the OR circuit 11i, in order to execute the process of below step S29. When a sequence Sa is not detected, that is, when equation (3) or equation (4) is not satisfied, the process returns to step S23. The expected value calculating unit 11f calculates an expected value, upon receiving the code value a(j+w−1) as illustrated in FIG. 13 (step S26).

Figure 16:
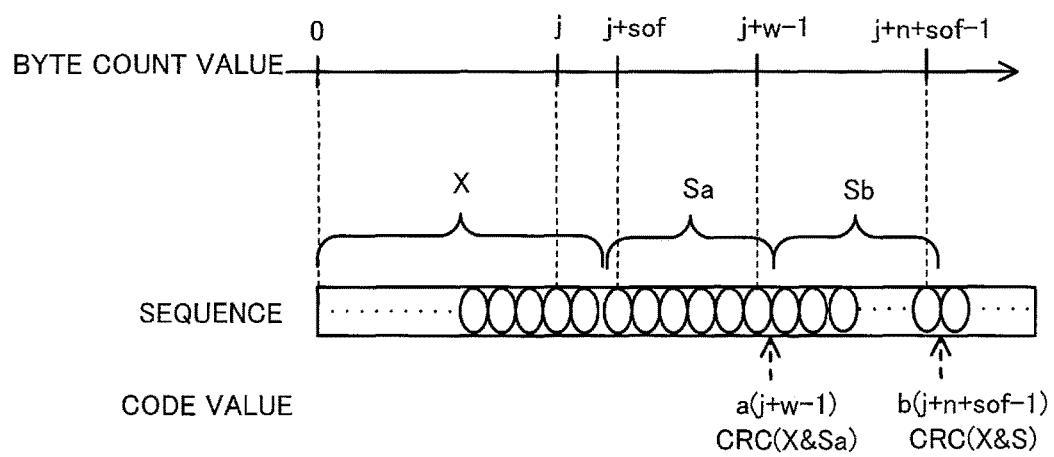
FIG. 16 illustrates a calculation example of an expected value for detecting a detection target sequence S.

FIG. 16 illustrates a calculation example of an expected value for detecting a detection target sequence S. As described above, the code value is a(j+w−1)=CRC(X&Sa), when a sequence Sa is detected. When the sequence Sa is followed by a sequence Sb, and the byte count value is j+n+sof−1, the following equation calculates CRC(X&S), which is an expected code value b(j+n+sof−1).

$$CRC(X\&S)=CRC(X\&Sa\&Sb)=CRC(X\&Sa\&0^{n-w+sof})+CRC(Sb)=H(n-w+sof)\cdot CRC(X\&Sa)+CRC(Sb) \quad (5)$$

Here, CRC(Sb) is the code value of the sequence Sb and is stored in one of the registers 11b1 to 11bp. Thus, the expected value calculating unit 11f reads the code value of the sequence Sb having the same identifier seqID as the sequence Sa from one of the registers 11b1 to 11bp, and calculates an expected value by the above equation (5). Thereafter, the code value calculating unit 11c updates the code value (step S27), and the determination unit 11h outputs a signal indicating that a detection target sequence is detected, when the code value output from the code value calculating unit 2b is equal to the expected value.

Figure 17:
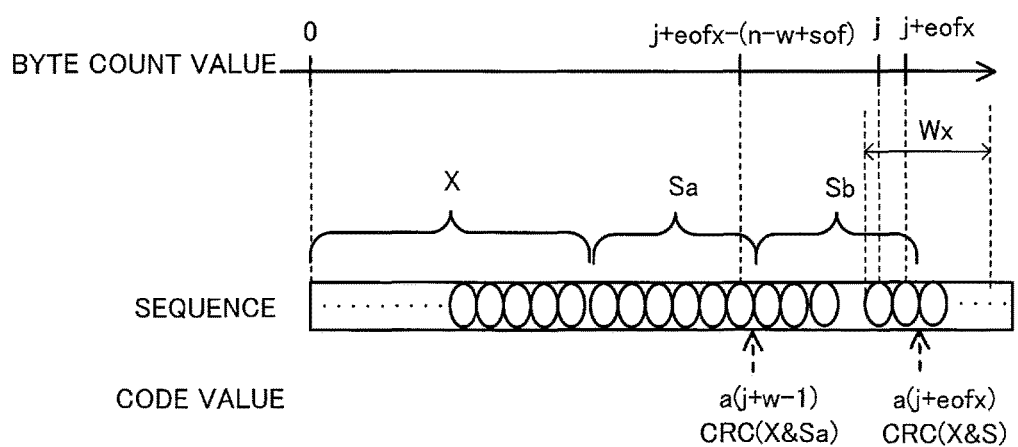
FIG. 17 illustrates exemplary detection of a detection target sequence.

FIG. 17 illustrates exemplary detection of a detection target sequence. The end of a sequence Sb is (n−w+sof) bytes after detecting a sequence Sa. In other words, the end of the sequence Sb is the eofx-th byte from the starting point of the ((n−w+sof)/w)-th word after the sequence Sa is detected. With regard to above (n−w+sof)/w, a value after a decimal point is rounded up. The eofx is calculated from the relationship between the length of the sequence Sb and a word length. In the example illustrated in FIG. 17, j represents the byte count value of the starting byte of a word Wx.

Thus, the determination unit 11h determines whether or not the code value a(j+eofx) obtained when the byte count value is j+eofx is equal to CRC(X&S) calculated by equation (5) (step S28). If the code value a(j+eofx) obtained when the byte count value is j+eofx is equal to CRC(X&S), the determination unit 11h outputs "1" to stop the operation of the user circuit 12 of debug target (step S29). Here, the process for stopping the user circuit 12 in response to detection of a certain detection target sequence ends.

For example, the determination unit 11h outputs "1" to stop the supply of clock signals to the user circuit 12, and thereby stops the operation of the user circuit 12. Also, the determination unit 11h may treat the user circuit 12 as being stopped, by cutting off data input to the user circuit 12 or data output from the user circuit 12. Thereafter, the debugger apparatus 20 performs a debugging operation, such as checking signals of each unit of the user circuit 12, for example.

If the code value a(j+eofx) obtained when the byte count value is j+eofx is not equal to CRC(X&S), the determination unit 11h determines that a detection target sequence S is not detected, and the process returns to step S23.

The above semiconductor device 10, the debug circuit 11, and the debugger apparatus 20 achieve the same effects as the semiconductor device 1, the debug circuit 2, and the debugger apparatus 4 of the first embodiment. Also, the process for stopping the user circuit 12 is executed on the basis of the code values of sequences Sa and sequences Sb with respect to a plurality of detection target sequences, in order to stop the user circuit 12 in a plurality of stop conditions.

(Circuit Example of First Sequence Detecting Unit 11e)

In the meantime, it is possible that the first sequence detecting unit 11e illustrated in FIG. 4 makes a determination on the basis of a CRC difference between any two bytes in a word, as indicated in equations (3) and (4). That is, w/2(w+1) determination conditions are evaluated at the maximum, where w is the number of bytes in a word.

Figure 18:
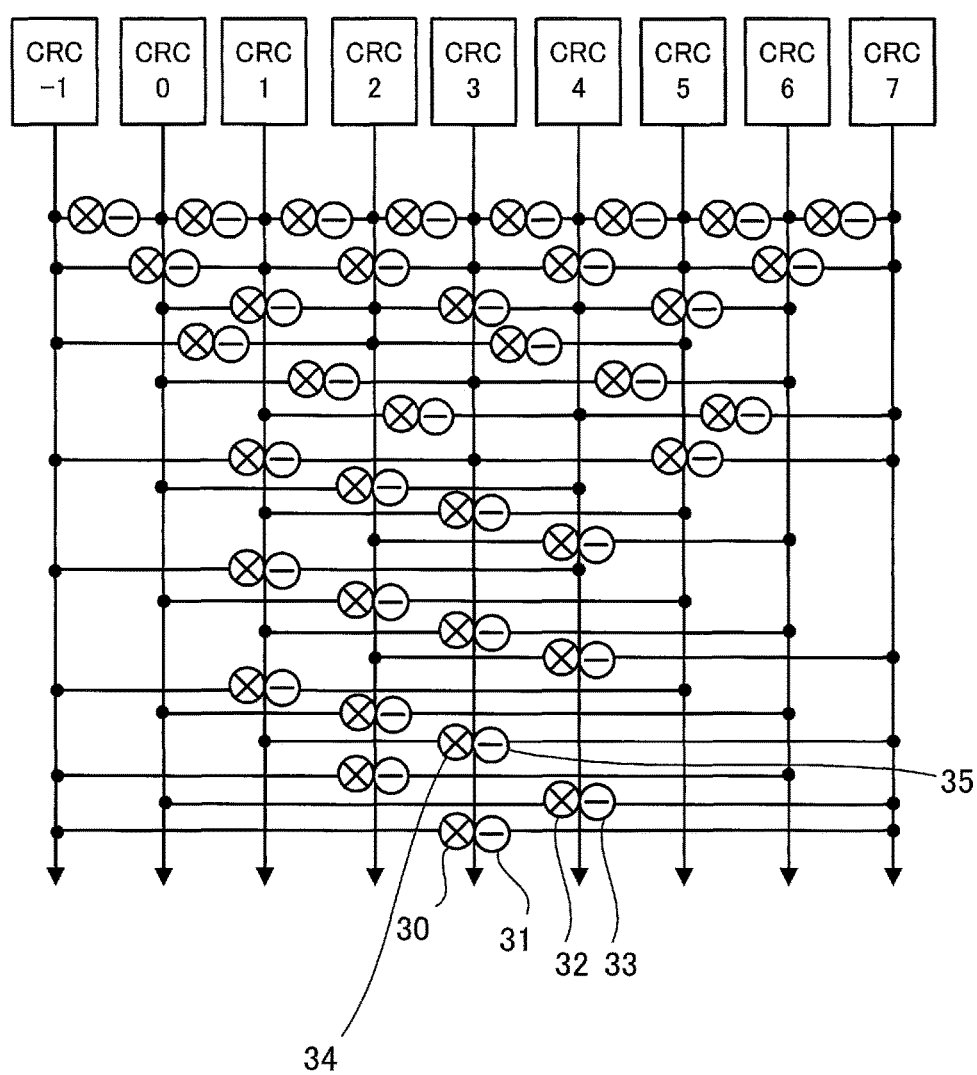
FIG. 18 illustrates an example of a first sequence detecting unit.

For example, the first sequence detecting unit 11e is configured with a circuit described below. FIG. 18 illustrates an example of the first sequence detecting unit. CRC-1 to CRC7 represent code values a(j−1) to a(j+7) which are output from the shift unit 11d, when w is 8. The first sequence detecting unit 11e includes a plurality of multipliers and a plurality of subtractors.

For example, when the first sequence detecting unit 11e detects a sequence Sa on the basis of the difference between the code value a(j−1) and the code value a(j+7) (i.e., when sof=0), a(j+7)−H(8)·a(j−1) is calculated on the basis of equation (3). In this case, the multiplier 30 calculates H(8)·a(j−1), and the subtractor 31 calculates a(j+7)−H(8)·a(j−1).

Then, a(j+7)−H(8)·a(j−1) is compared with the code value CRC(Sa) stored in the register 11a1 for example, by a comparison circuit (not depicted) in the first sequence detecting unit 11e. Then, if a(j+7)−H(8)·a(j−1) is equal to the code value CRC(Sa), a sequence Sa is assumed to be detected, and the code value a(j+7) is supplied to the expected value calculating unit 11f.

Also, the first sequence detecting unit 11e illustrated in FIG. 18 simultaneously detects sequences Sa corresponding to a plurality of detection target sequences of different numbers of bytes sof, on the basis of the difference between 9-byte code values which are output from the shift unit 11d. For example, in order to detect sequences Sa of two detection target sequences of sof=1 and 2, a multiplier 32 and a subtractor 33 calculate a(j+7)−H(7)·a(j), and simultaneously a multiplier 34 and a subtractor 35 calculate a(j+7)−H(6)·a(j+1). Then, the sequences Sa of the two detection target sequences are detected on the basis of comparison results, by a comparison unit (not depicted), between the calculated values and the code values contained in the registers 11a1 to 11ap.

In the same way, a plurality of detection target sequences that are entirely contained in one word can be detected simultaneously. Also, the first sequence detecting unit 11e may determine that a sequence Sa is detected, when one or a plurality of sequences included in the sequence Sa are detected in addition to the sequence Sa, by using the circuit illustrated in FIG. 18.

FIG. 19 illustrates exemplary detection of a sequence Sa. "Byte offset" indicates a position of a byte, where the position of the starting byte of a word is 0. "Byte offset"–0 corresponds to byte count value j. The code values of bytes of byte positions (−1 to +7) are represented by a(j−1) to a(j+7).

When detecting a sequence Sa on the basis of a comparison result between CRC(Sa) and the difference between code values a(j+2) and a(j+7), the first sequence detecting unit 11e also detects one or a plurality of sequences included in the sequence Sa in addition to the sequence Sa itself.

For example, the first sequence detecting unit 11e determines whether or not a difference between code values at each byte of the sequence Sa corresponds to one of code values of sequence Saa, Sab, Sac, or Sad included in the sequence Sa. Note that the code values of the sequences Saa to Sad are calculated by the debugger apparatus 20 and are stored in the register 11a1 of the debug circuit 11 in advance, for example. Then, the first sequence detecting unit 11e determines that the sequence Sa is detected, when determining that all differences correspond to the code values of the sequences Saa to Sad.

The number of bits is constant in CRC, and thus it is possible that the same CRC value is calculated for different sequences. However, as described above, detecting a sequence Sa and one or a plurality of sequences included in the sequence Sa makes it less likely to erroneously detect a sequence that is different from the detection target sequence Sa.

Note that the same process can be executed for a plurality of detection target sequences that are contained in one word, in order to reduce the possibility of detecting a different sequence erroneously.

In the meantime, in the first sequence detecting unit 11e illustrated in FIG. 18, an area of multipliers for performing multiplication using Hamming matrices is comparatively large, and thus the number of multipliers is reduced as described below in order to reduce the area.

For example, four detection target sequences SXa, SXb, SXc, and SXd that are contained in the sequence Sa or a word are detected. FIG. 20 illustrates an example of four sequences. In the same way as FIG. 19, code values corresponding to "Byte offset" are illustrated in FIG. 20.

The sequence SXa is detected when a(j+7)−H(8)·a(j−1)=CRC(SXa) is satisfied, and the sequence SXb is detected when a(j+3)−H(4)·a(j−1)=CRC(SXb) is satisfied. Also, the sequence SXc is detected when a(j+5)−H(2)·a(j+3)=CRC(SXc) is satisfied, and the sequence SXd is detected when a(j+7)−H(4)·a(j+3)=CRC(SXd) is satisfied. Note that CRC(SXa) to CRC(SXd) are code values of the sequences SXa to SXd stored in four of the registers 11a1 to 11ap.

In this example, multiplications of Hamming matrices H(8), H(4), and H(2) are performed four times totally. In order to reduce the number of multiplications, values obtained by multiplying code values output from the shift unit 11d by H(k) (where k=w−(Byte offset+1)) are used in the following, for example.

FIG. 21 illustrates an example of code values multiplied by H(k). The code value a(j−1) is multiplied by H(8). The code value a(j) is multiplied by H(7). The code value a(j+1) is multiplied by H(6). The code value a(j+2) is multiplied by H(5). The code value a(j+3) is multiplied by H(4). The code value a(j+4) is multiplied by H(3). The code value a(j+5) is multiplied by H(2). The code value a(j+6) is multiplied by H(1). The code value a(j+7) is as it is.

With these code values, the sequence SXa is detected, when a(j+7)−{H(8)·a(j−1)}=CRC(SXa) is satisfied. The sequence SXb is detected, when {H(4)·a(j+3)}−{H(8)·a(j−1)}={H(4)·CRC(SXb)} is satisfied. The sequence SXc is detected, when {H(2)·a(j+5)}−{H(4)·a(j+3)}={H(2)·CRC(SXc)} is satisfied. The sequence SXd is detected, when a(j+7)−{H(4)·a(j+3)}=CRC(SXd) is satisfied.

In this case, the sequences SXa to SXd are detected by only three multiplications of {H(8)·a(j−1)}, {H(4)·a(j+3)}, and {H(2)·a(j+5)}. {H(4)·CRC(SXb))} and {H(2)·CRC(SXc)} of right hand sides of the above equations are stored in the registers 11a1 to 11ap in advance, and thus the number of multipliers does not increase.

Figure 22:
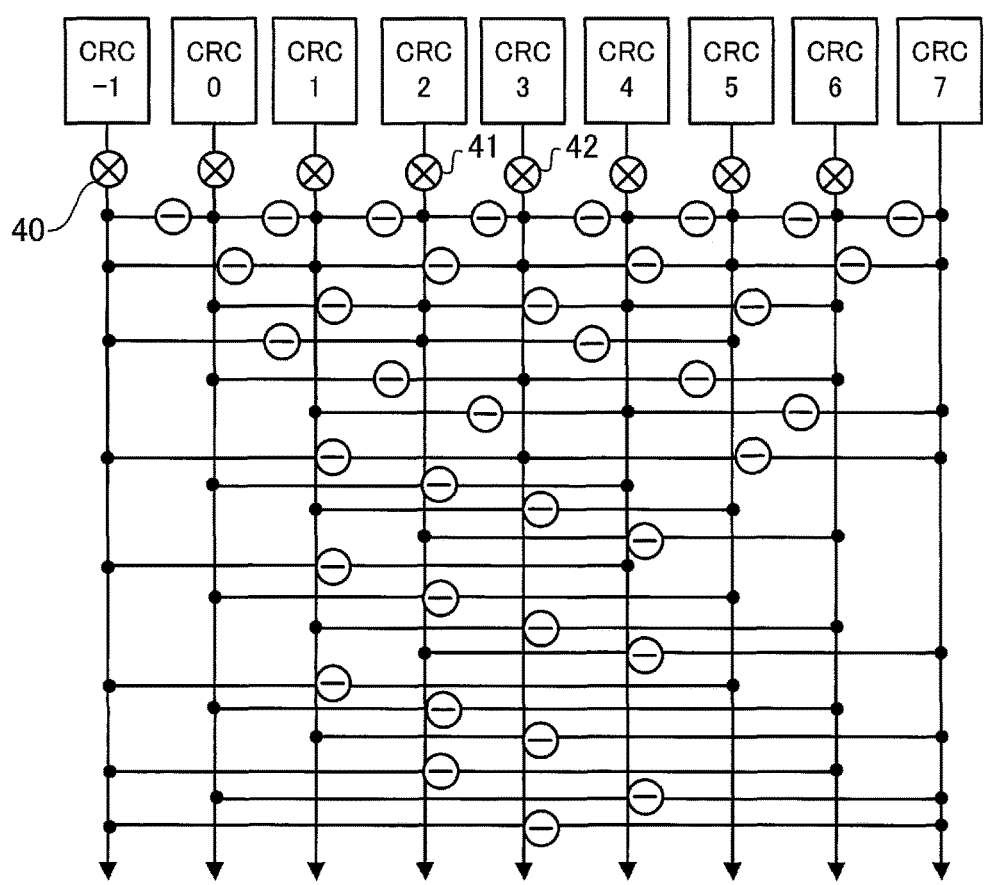
FIG. 22 illustrates another example of a first sequence detecting unit.

A first sequence detecting unit 11ea that realizes the above equations (its reference sign is altered to distinguish from the first sequence detecting unit 11e of FIG. 18) is a circuit described below, for example. FIG. 22 illustrates another example of the first sequence detecting unit.

CRC-1 to CRC7 represent code values a(j−1) to a(j+7), which are output from the shift unit 11d, when w is 8. The first sequence detecting unit 11ea includes eight multipliers for multiplying the code values a(j−1) to a(j+6) by H(8) to H(1) respectively, as illustrated in FIG. 21. For example, when the sequences SXa to SXd are detected, the multiplier 40 calculates {H(8)·a(j−1)}, and the multiplier 41 calculates {H(5)·a(j+2)}, and the multiplier 42 calculates {H(4)·a(j+3)}.

Although the number of multipliers in the first sequence detecting unit 11e illustrated in FIG. 18 is w(w+1)/2, the number of multipliers in the first sequence detecting unit 11ea illustrated in FIG. 22 is reduced to w (w=8 in the example of FIG. 22), and thus their area is reduced.

(Integration of Code Value Calculating Unit 11c and Shift Unit 11d)

Code values c(j) to c(j+w−1) output from the shift unit 11d correspond to the code values a(j) to a(j+w−1) of one word calculated by the code value calculating unit 11c of the debug circuit 11 illustrated in FIG. 4, respectively. The code values c(j) to c(j+w−1) are expressed by the next equation.

$$\begin{bmatrix} c(j+w-1) \\ \vdots \\ c(j) \end{bmatrix} = \begin{pmatrix} I & 0 & \cdots & \emptyset \\ 0 & H(1) & \ddots & \vdots \\ \vdots & & \ddots & 0 \\ \emptyset & \cdots & 0 & H(w) \end{pmatrix} \begin{bmatrix} a(j+w-1) \\ \vdots \\ a(j) \end{bmatrix} \quad (6)$$

In equation (6), I represents an identity matrix.

In the meantime, the code value calculating unit 11c calculates the code values a(j) to a(j+w−1) by equation (1), as described above. Here, equation (1) and equation (6) can be simplified to below equation (7).

$$\begin{bmatrix} c(j+w-1) \\ \vdots \\ c(j) \end{bmatrix} = \begin{pmatrix} I & 0 & \cdots & \emptyset \\ 0 & H(1) & \ddots & \vdots \\ \vdots & & \ddots & 0 \\ \emptyset & \cdots & 0 & H(w) \end{pmatrix} \begin{bmatrix} a(j+w-1) \\ \vdots \\ a(j) \end{bmatrix}$$

$$= \begin{pmatrix} I & 0 & \cdots & \emptyset \\ 0 & H(1) & \ddots & \vdots \\ \vdots & & \ddots & 0 \\ \emptyset & \cdots & 0 & H(w) \end{pmatrix} \begin{pmatrix} H(1) & H(2) & \cdots & H(w) \\ 0 & H(1) & \ddots & \vdots \\ \vdots & & \ddots & H(2) \\ \emptyset & \cdots & 0 & H(1) \end{pmatrix}$$

$$\begin{bmatrix} D(j+w-1) \\ \vdots \\ D(j) \end{bmatrix} \quad (7)$$

$$= \begin{pmatrix} H(1) & H(2) & \cdots & H(w) \\ 0 & H(2) & \ddots & \vdots \\ \vdots & & \ddots & H(w) \\ \emptyset & \cdots & 0 & H(w) \end{pmatrix} \begin{bmatrix} D(j+w-1) \\ \vdots \\ D(j) \end{bmatrix} \quad 5$$

The code value calculating unit 11c is configured with a circuit that realizes equation (7), in order to provide the function of the shift unit 11d as well. Also, the matrix of equation (7) is an upper triangular matrix, and the number of nonzero elements is substantially same as equation (1), and thus multiplication circuits do not increase so much even if the function of the shift unit 11d is integrated.

(Exemplary Variant of Setting of Number of Bytes sof)

In the above description, the number of bytes sof (start offset) from the starting point of a word to the starting point of a detection target sequence is specified in advance. However, the start offset may be unspecified. The range of start offset value depends on word length, and thus the debugger apparatus 20 may set start offsets of the number according to word length and calculate code values of sequences Sa and Sb corresponding to respective start offset values. These values are set in the registers 11a1 to 11ap and 11b1 to 11bp of the debug circuit 11 in order to be used in detection of detection target sequences.

Figure 23:
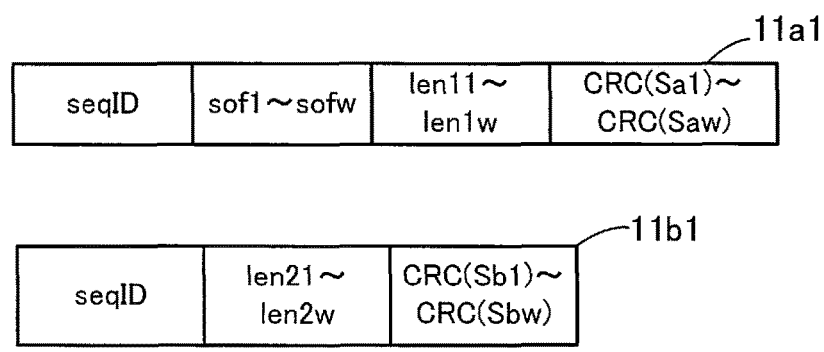
FIG. 23 illustrates a data containment example of registers when a start offset is unspecified.

FIG. 23 illustrates a data containment example of registers when the start offset is unspecified. In the register 11a1, the numbers of bytes sof1 to sofw (w types) are stored as start offsets. The numbers of bytes sof1 to sofw are 0 (no offset) to w−1 bytes. Further, the register 11a1 stores lengths len11 to len1w of sequences Sa1 to Saw and code values CRC(Sa1) to CRC(Saw) of the sequences Sa1 to Saw, which correspond to the numbers of bytes sof1 to sofw respectively. The register 11b1 stores lengths len21 to len2w of sequences Sb1 to Sbw and code values CRC(Sb1) to CRC(Sbw) of the sequences Sb1 to Sbw, which correspond to the numbers of bytes sof1 to sofw respectively.

The first sequence detecting unit 11e detects the sequences Sa1 to Saw by using CRC(Sa1) to CRC(Saw).

The expected value calculating unit 11f calculates the aforementioned expected values, using code values CRC(Sb1) to CRC(Sbw) of sequences Sb1 to Sbw which correspond to the detected sequences Sa1 to Saw. Thereby, a detection target sequence can be detected even when the start offset is unspecified.

Although one aspect of the debug circuit, the semiconductor device, and the debug method has been described above with reference to the embodiments, these embodiments are just examples, and the present embodiments are not limited to the above description.

According to the disclosed debug circuit, semiconductor device, and debug method, work efficiency of debugging is improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A debug circuit comprising:
a memory configured to store a first code value calculated by encoding a first sequence, contained in a first word, of a detection target sequence, a second code value calculated by encoding a remaining second sequence of the detection target sequence, and a first byte number indicating the number of bytes from a starting point of the first word to a starting point of the detection target sequence, wherein the first code value and the second code value are calculated in accordance with an encoding method that calculates different values depending on a signal sequence in a debug target circuit that processes word by word;
a code value calculation circuit configured to calculate a plurality of different third code values for each byte included in words of the signal sequence in accordance with the encoding method;
a first sequence detection circuit configured to detect the first sequence on the basis of a comparison result between the first code value and a difference between a fourth code value at a last byte of the first word of the signal sequence and a fifth code value at a byte positioned according to the first byte number, wherein each of the fourth code value and the fifth code value is one of the plurality of different third code values;
an expected value calculation circuit configured to calculate an expected value of one of the plurality of different third code values at the end of the detection target sequence, on the basis of the second code value and a sixth code value obtained when the first sequence is detected, wherein the sixth code value is one of the plurality of different third code values;
a determination circuit configured to output a signal indicating that the detection target sequence is detected, when one of the plurality of different third code values is equal to the expected value; and
a logic circuit configured to stop an operation of the debug target circuit when the determination circuit outputs the signal.

2. The debug circuit according to claim 1, wherein the encoding method calculates a code value having linearity.

3. The debug circuit according to claim 1, wherein when the detection target sequence is contained in the first word, the first sequence detection circuit detects the detection target sequence on the basis of a comparison result between the first code value and a difference between the fifth code value and a seventh code value at a byte positioned according to a second byte number obtained by adding the first byte number and the number of bytes of the detection target sequence.

4. The debug circuit according to claim 1, wherein the memory stores one or a plurality of eighth code values obtained by encoding one or a plurality of third sequences in the first sequence in accordance with the encoding method, and
the first sequence detection circuit determines that the first sequence is detected, when all of the third sequences are detected on the basis of the eighth code values and differences between a plurality of ninth code values corresponding to a plurality of bytes in the first sequence.

5. The debug circuit according to claim 1, wherein a plurality of first byte numbers are stored in the memory, according to a length of the first word, and a plurality of first code values and a plurality of second code values are stored for the respective first byte numbers, and the first sequence detection circuit detects first sequences corresponding to the first byte numbers.

6. The debug circuit according to claim 1, wherein the detection target sequence is provided in a plurality, and the first sequence detection circuit simultaneously detects first sequences corresponding to the detection target sequences.

7. The debug circuit according to claim 1, wherein the first sequence detection circuit includes a plurality of multipliers configured to multiply one of the plurality of different third code values calculated by the code value calculation circuit by an Hamming matrix, the number of multipliers according to a word length, and a plurality of subtractors configured to calculate differences between outputs of the multipliers, and detects the first sequence on the basis of a comparison result between outputs of the subtractors and the first code value.

8. A semiconductor device comprising:

a debug target circuit configured to process word by word; and a debug circuit including:

a memory configured to store a first code value calculated by encoding a first sequence, contained in a first word, of a detection target sequence, a second code value calculated by encoding a remaining second sequence of the detection target sequence, and a first byte number indicating the number of bytes from a starting point of the first word to a starting point of the detection target sequence, wherein the first code value and the second code value are calculated in accordance with an encoding method that calculates different values depending on a signal sequence in the circuit, a code value calculation circuit configured to calculate a plurality of different third code values for each byte included in words of the signal sequence in accordance with the encoding method, a first sequence detection circuit configured to detect the first sequence on the basis of a comparison result between the first code value and a difference between a fourth code value at a last byte of the first word of the signal sequence and a fifth code value at a byte positioned according to the first byte number, wherein each of the fourth code value and the fifth code value is one of the plurality of different third code values, an expected value calculation circuit configured to calculate an expected value of one of the plurality of different third code values at the end of the detection target sequence, on the basis of the second code value and a sixth code value obtained when the first sequence is detected, wherein the sixth code value is one of the plurality of different third code values, a determination circuit configured to output a signal indicating that the detection target sequence is detected, when one of the plurality of different third code values is equal to the expected value, and a logic circuit configured to stop an operation of the debug target circuit when the determination circuit outputs the signal.

9. A debug method comprising:

dividing, by a debugger apparatus, a detection target sequence that is to be detected from a signal sequence of a debug target circuit that processes word by word, into a first sequence contained in a first word and a remaining second sequence;

calculating, by the debugger apparatus, a first code value and a second code value by encoding the first sequence and the second sequence respectively in accordance with an encoding method that calculates different values depending on the signal sequence;

transmitting, by the debugger apparatus, the first code value, the second code value, and a first byte number indicating the number of bytes from a starting point of the first word to a starting point of the detection target sequence;

receiving, by a semiconductor device including the debug target circuit, the first code value, the second code value, and the first byte number;

calculating, by a code value calculation circuit in the semiconductor device, a plurality of different third code values for each byte included in words of the signal sequence in accordance with the encoding method;

detecting, by a first sequence detection circuit in the semiconductor device, the first sequence on the basis of a comparison result between the first code value and a difference between a fourth code value at a last byte of the first word of the signal sequence and a fifth code value at a byte positioned according to the first byte number, wherein each of the fourth code value and the fifth code value is one of the plurality of different third code values;

calculating, by an expected value calculation circuit in the semiconductor device, an expected value of one of the plurality of different third code values at the end of the detection target sequence, on the basis of a sixth code value obtained when the first sequence is detected and the second code value, wherein the sixth code value is one of the plurality of different third code values;

outputting, by a determination circuit in the semiconductor device, a signal indicating that the detection target sequence is detected, when one of the plurality of different third code values is equal to the expected value; and stopping, by a logic circuit in the semiconductor device, an operation of the debug target circuit when the determination circuit outputs the signal.

* * * * *